United States Patent [19]
Liao

[11] Patent Number: 5,628,101
[45] Date of Patent: May 13, 1997

[54] ASSEMBLY MACHINE FOR IMPLANTING PINS

[76] Inventor: Bi-Hu Liao, 58, Ma Yuan West St., Taichung, Taiwan

[21] Appl. No.: 581,987

[22] Filed: Jan. 2, 1996

[51] Int. Cl.⁶ .............................. B23P 19/02; H05K 13/04
[52] U.S. Cl. .............................................. 29/33 K; 29/739
[58] Field of Search .................................. 29/33 K, 33 M, 29/566.2, 739, 754, 759, 845, 832, 837; 227/139, 104

[56] References Cited

U.S. PATENT DOCUMENTS

| | | | |
|---|---|---|---|
| 3,711,924 | 1/1973 | Olney, Jr. et al. | 227/139 |
| 3,765,075 | 10/1973 | Olney, Jr. et al. | 29/739 X |
| 3,835,521 | 9/1974 | Crump et al. | 29/739 |
| 4,099,324 | 7/1978 | Johnson et al. | 29/759 X |
| 4,398,628 | 8/1983 | Chisholm | 29/845 |
| 4,748,741 | 6/1988 | Donovan | 29/739 |

FOREIGN PATENT DOCUMENTS 2045117  10/1980  United Kingdom ................. 29/33 K Primary Examiner—William R. Briggs

[57] ABSTRACT

An assembly machine for implanting pins has a casing, a retarder, a hopper, a guide pipe, a guide recess, a seat, a chuck device, and a link. The hopper has spaced driving bolts, spaced chutes on the cone-shaped portion, a seat connecting the cone-shaped portion, a block on the seat, a shaft adjacent to the block, a rod connecting the shaft. A stretch spring connects a cylinder which is adjacent to the block and a bolt which is disposed on the driving rod. A rod which connects the shaft is adjacent to a notch. The seat has a slot communicating with the recess. A gap is at the bottom of the slot. A movable plate is at the bottom of the seat, and a spring is at the bottom of the movable plate. The chuck device has a bottom plate, a chuck, an extensible plate, a notch at the front end of the extensible platel, a rear board, an upper board and a lower board. A funnel matches a pin-guiding device which is supported by a seat. The funnel receives a plunger.

3 Claims, 23 Drawing Sheets

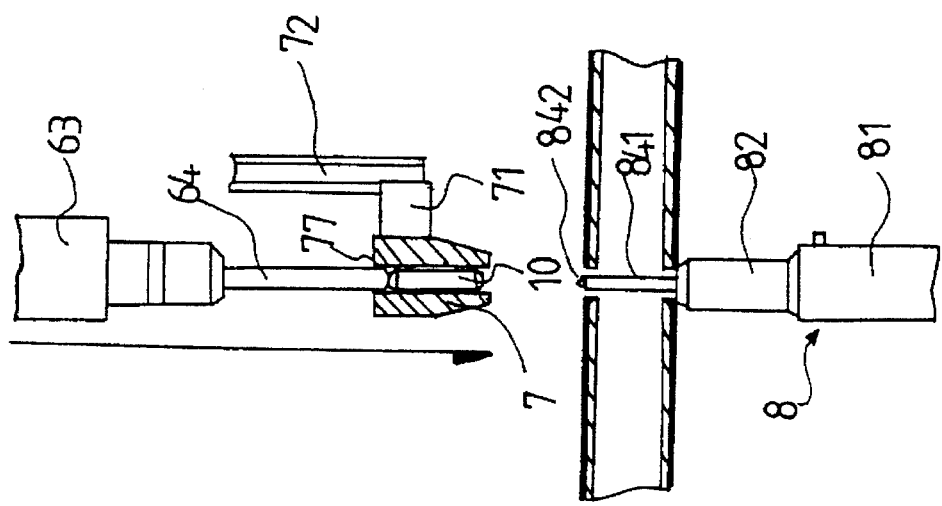

5,628,101

ASSEMBLY MACHINE FOR IMPLANTING PINS

BACKGROUND OF THE INVENTION

The invention relates to an assembly machine for implanting pins. More particularly, the invention relates to a machine for implanting pins automatically.

A pin is often implanted in a device manipulatively. It is time-consuming to implant pins in an assembly line. Therefore, it is necessary to invent an assembly machine for implanting pins automatically.

SUMMARY OF THE INVENTION

An object of the invention is to provide an assembly machine which can implant pins automatically.

Another object of the invention is to provide an assembly machine which can feed pins, clamp pins and implant pins in order.

DETAILED DESCRIPTION OF THE INVENTION

Figure 1:
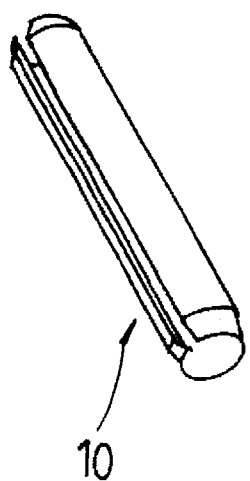
FIG. 1 is a perspective view of an elastic pin.
Figure 2:
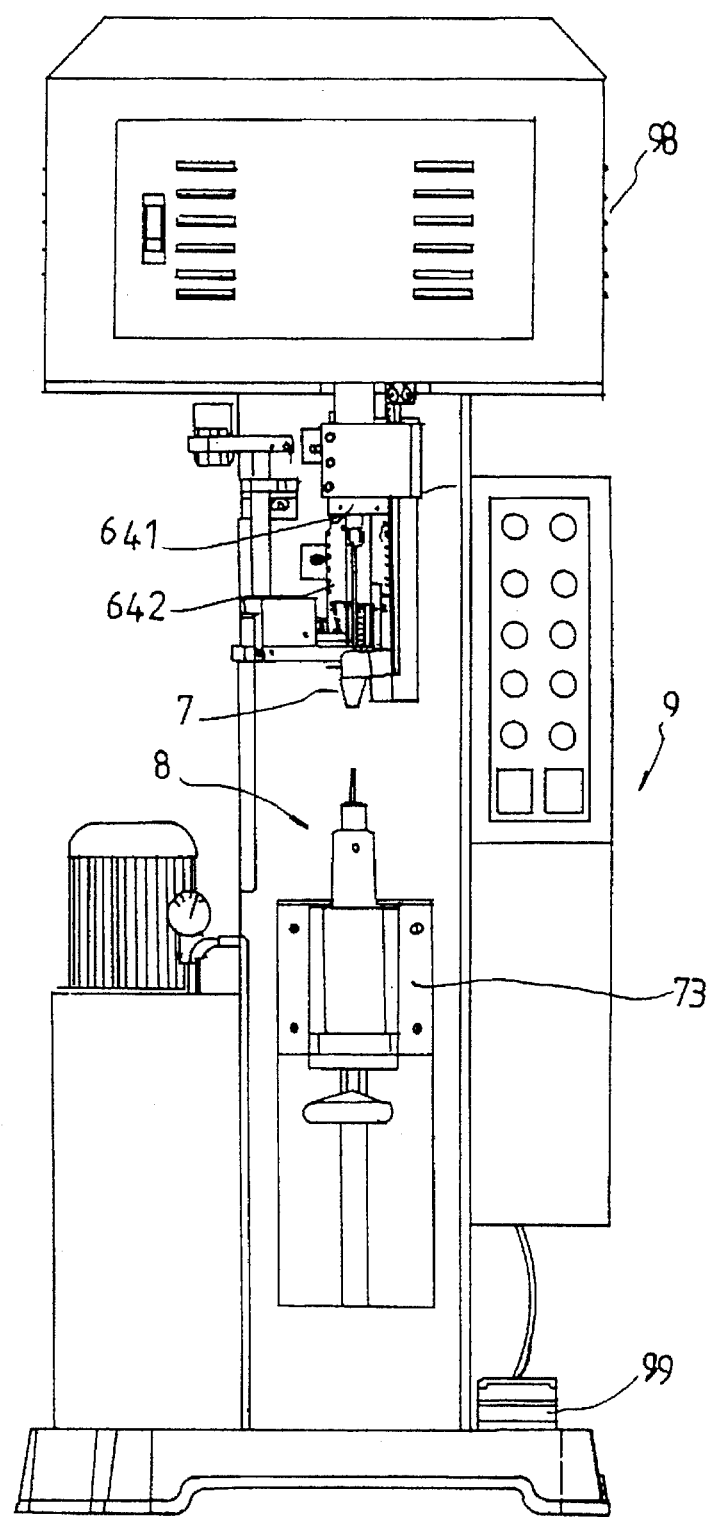
FIG. 2 is a perspective assembly view of an assembly machine for implanting pins.
Figure 3:
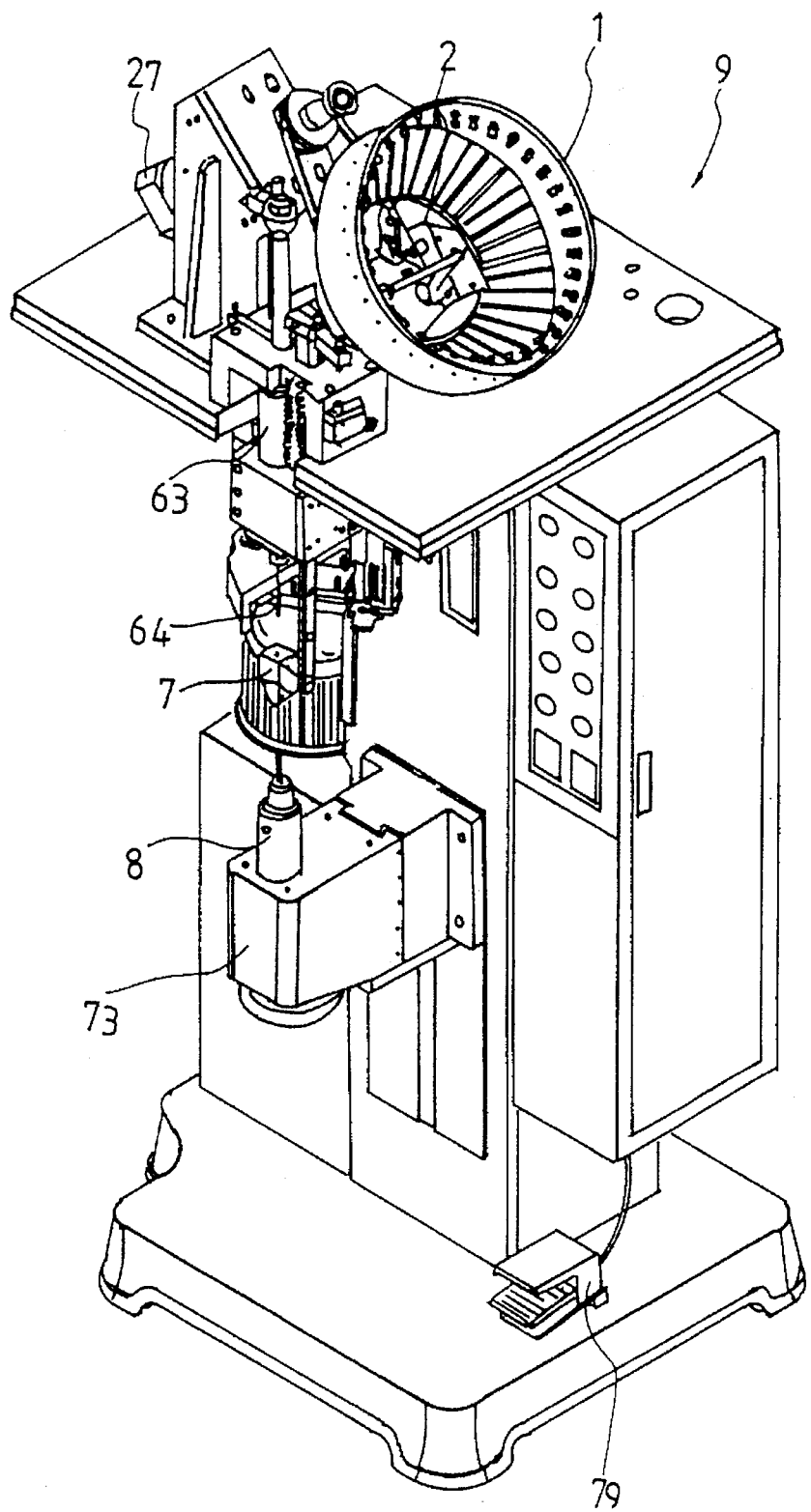
FIG. 3 is a perspective assembly view of an assembly machine for implanting pins without the protective casing.
Figure 4A:
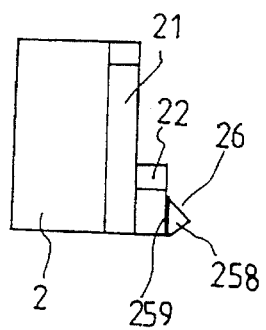
FIG. 4A is a side elevational view of the connecting seat, the guide plate and the pin-setting rod.
Figure 4:
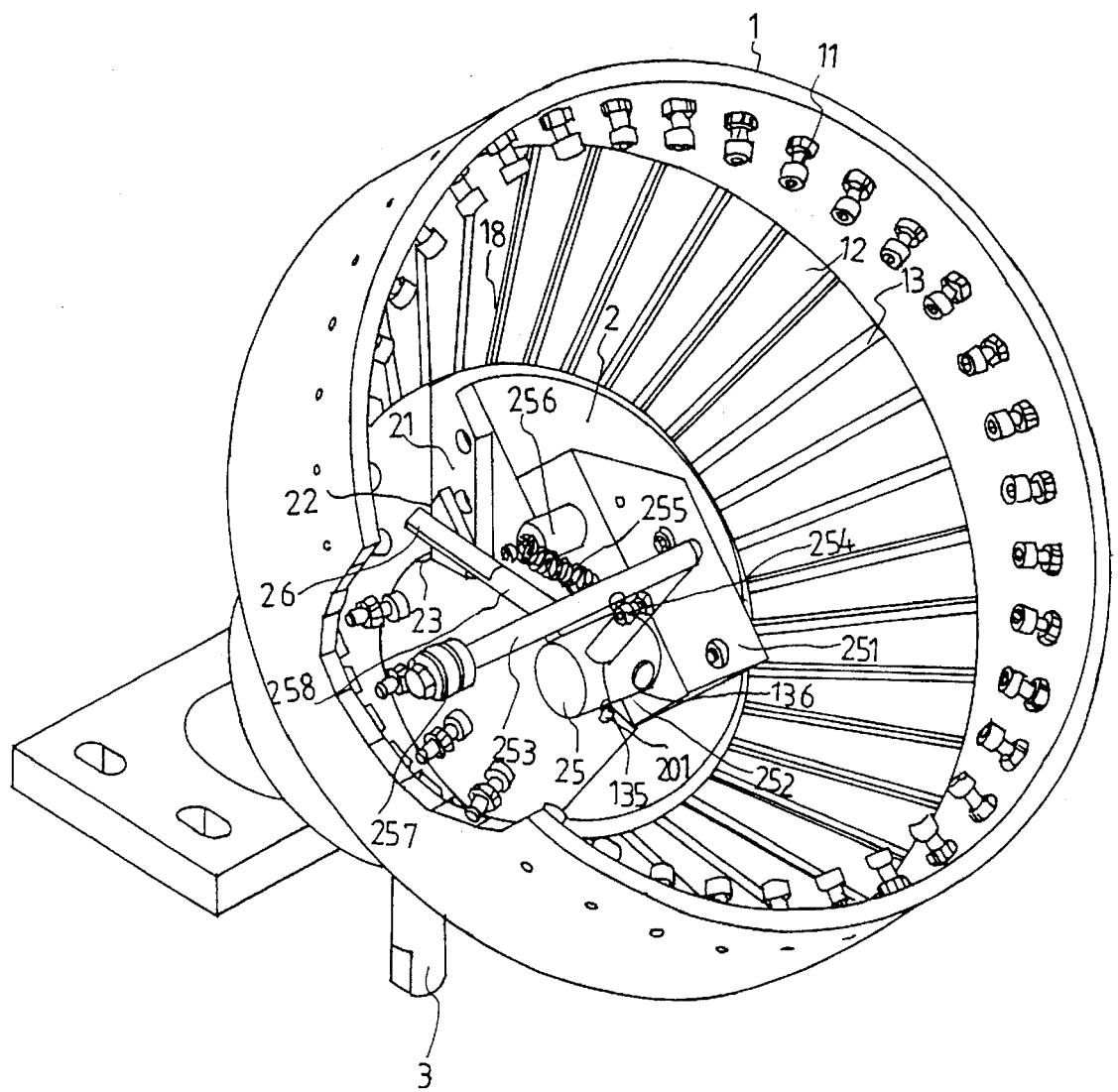
FIG. 4 is an enlarged perspective view of the charging hopper.
Figure 5:
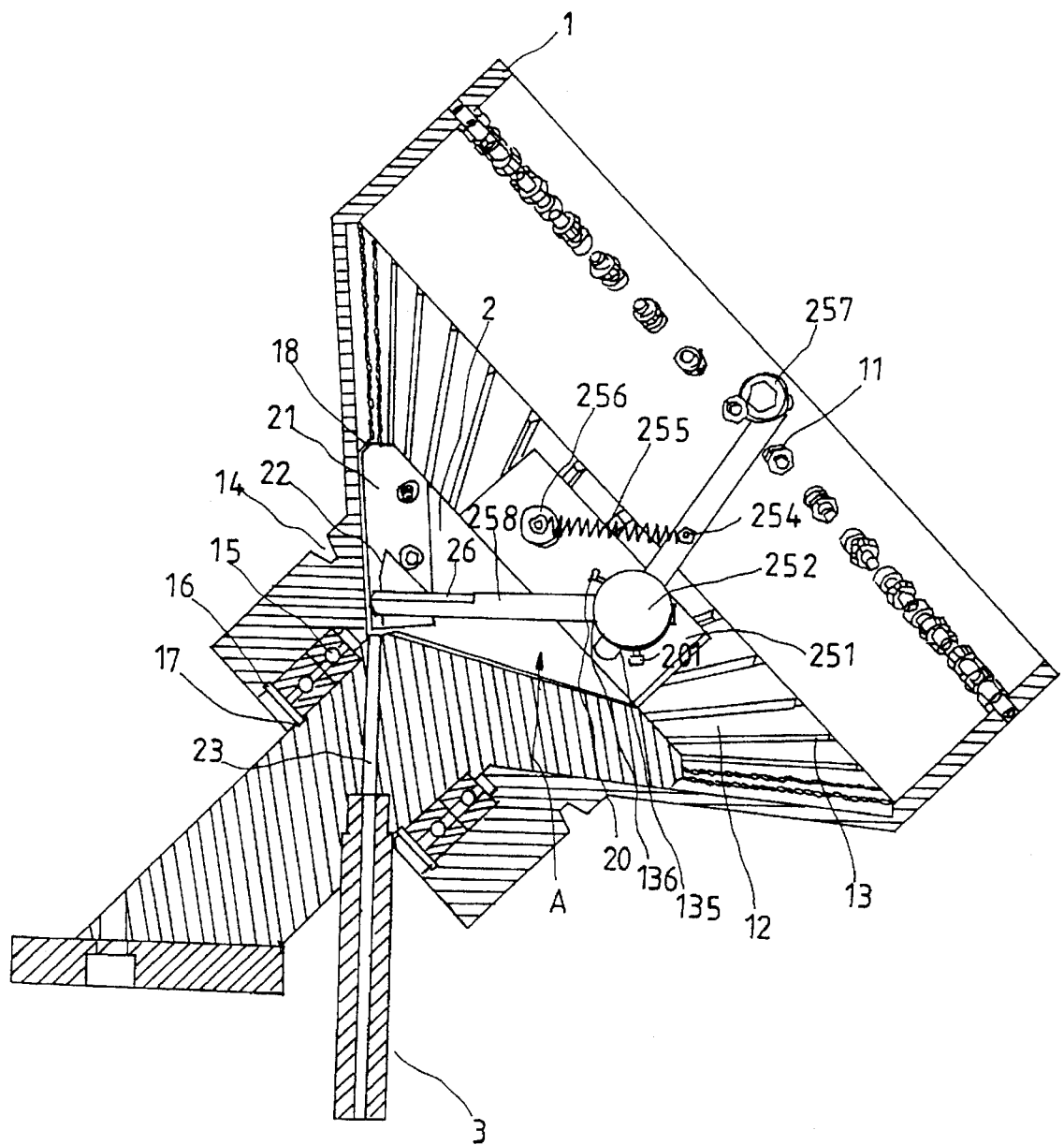
FIG. 5 is a partially cross-sectional view of FIG. 4.
Figure 6:
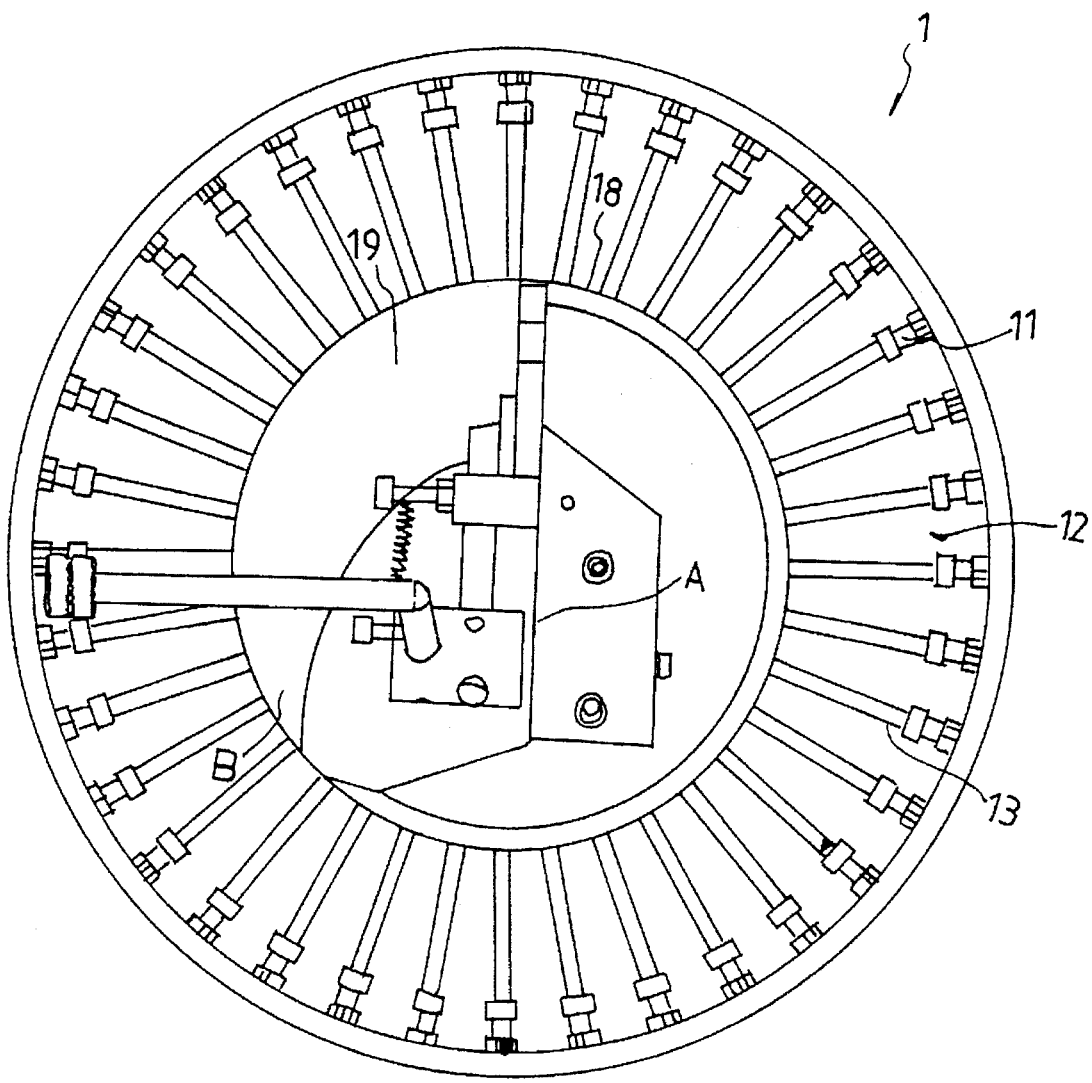
FIG. 6 is a top plan view of FIG. 4.
Figure 7:
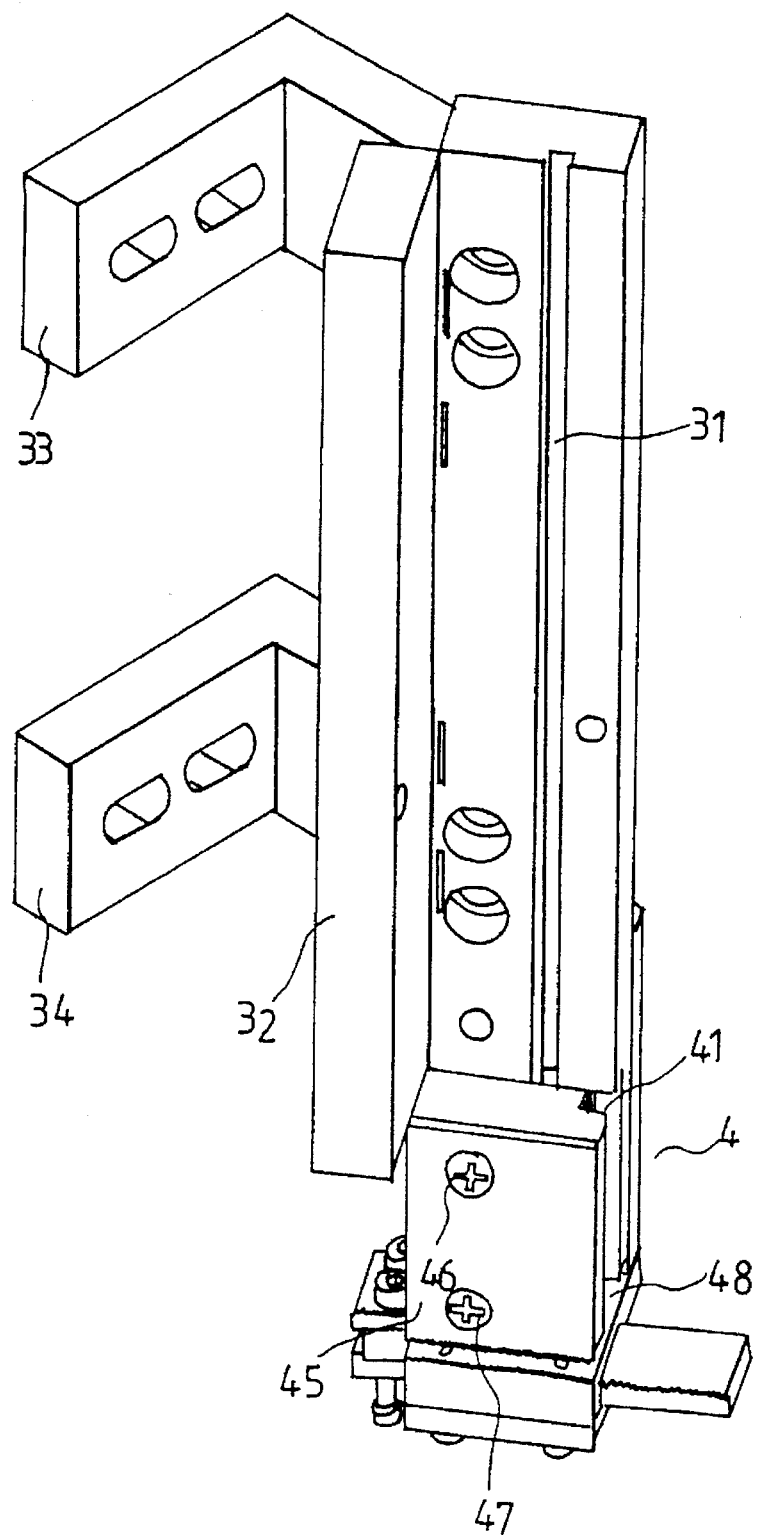
FIG. 7 is a perspective view of the guide recess and the pin-separating seat.
Figure 8:
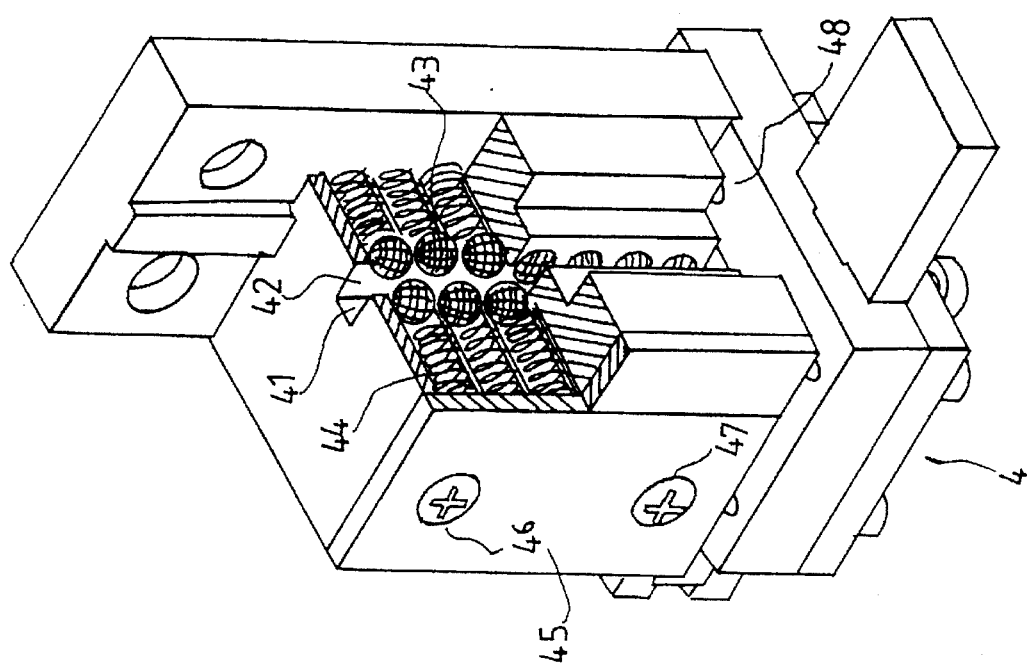
FIG. 8 is a partially cross-sectional view of a pin-separating seat.
Figure 9A:
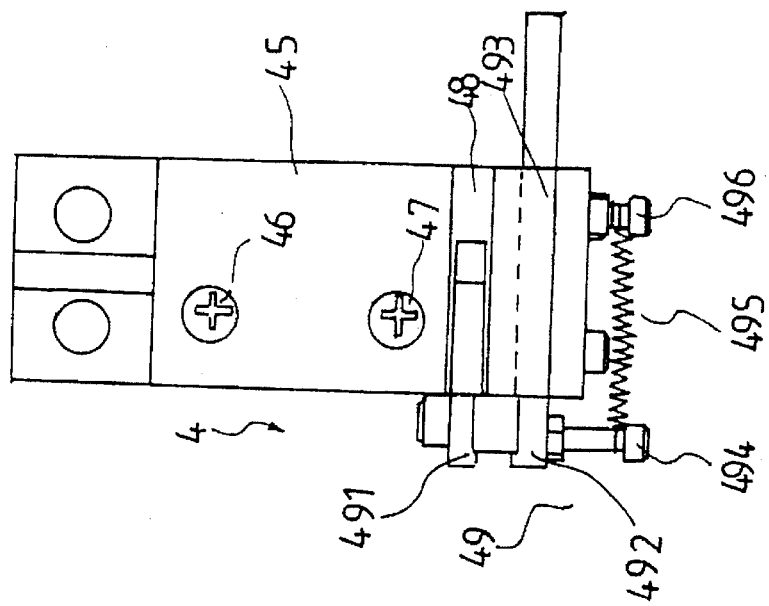
FIGS. 9 to 9C are schematic views illustrating the operation of the pin-separating seat.
Figure 9:
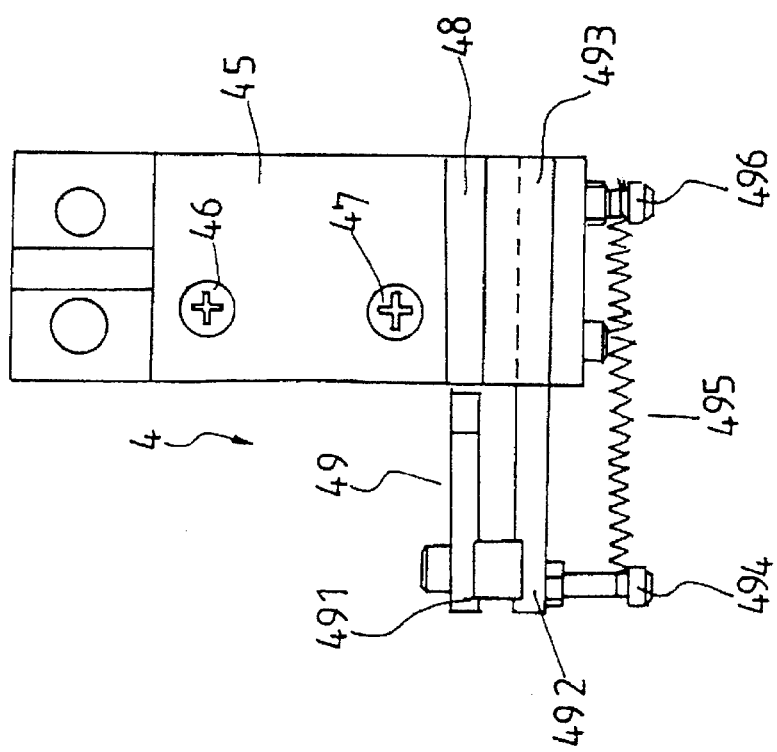
Figure 9C:
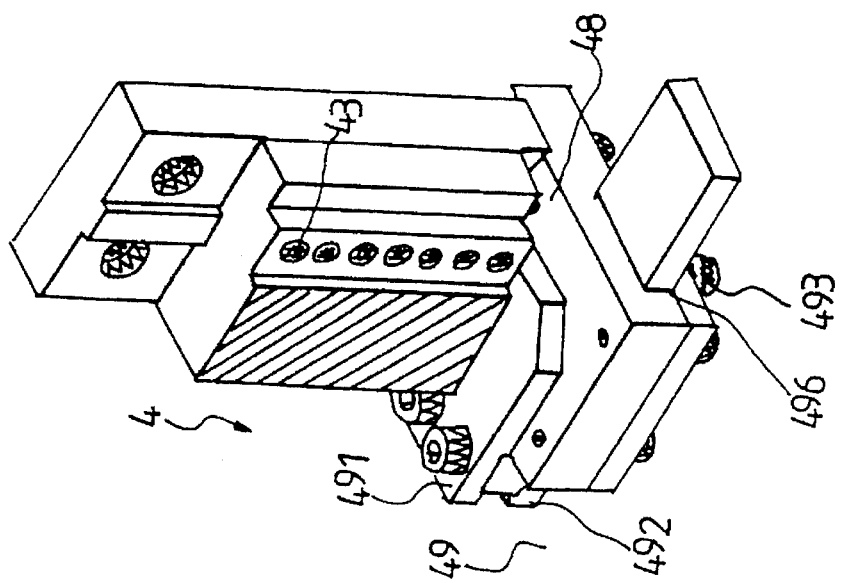
Figure 9B:
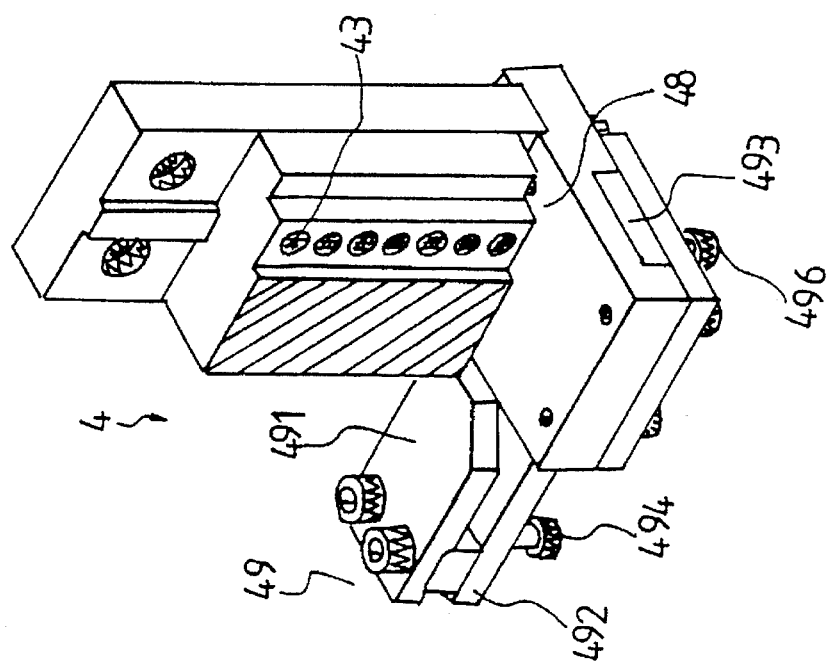
Figure 17:
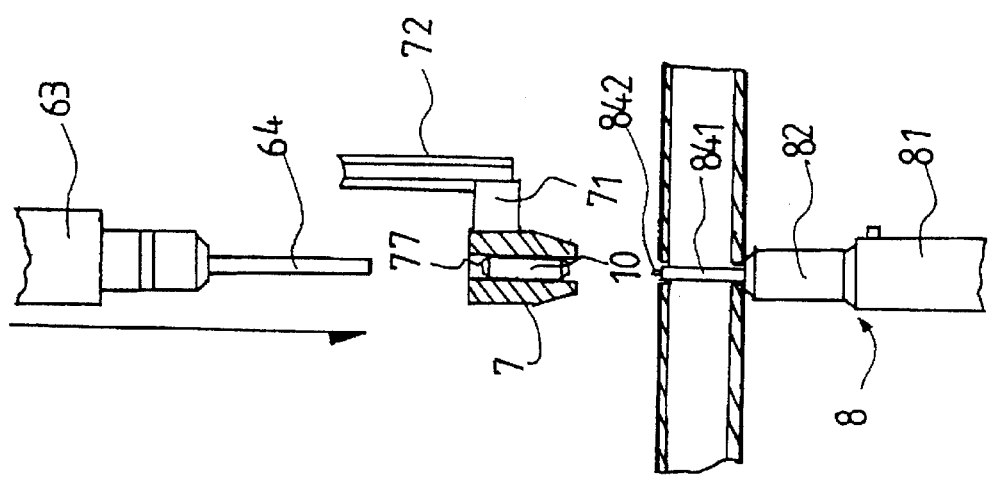
FIGS. 17 to 17C are schematic views illustrating the operation of the plunger, the pin-clamping funnel and the pin-guiding device.
Figure 17C:
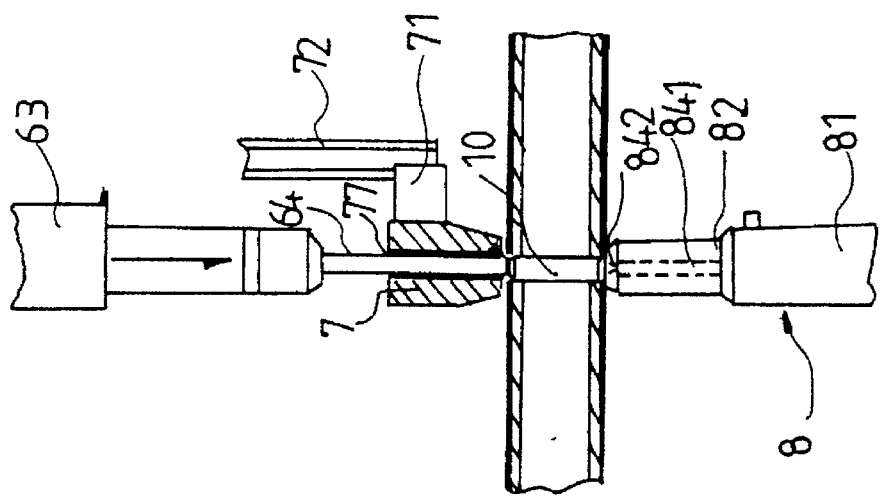
Figure 17B:
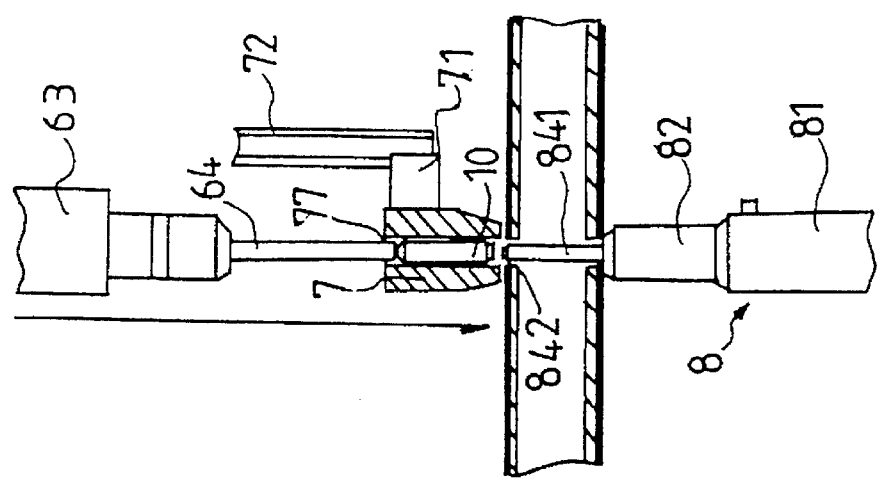

FIG. 1 illustrates an elastic pin 10 which can be implanted in different kinds of articles. The pin 10 can be inserted in a pin-clamping funnel 7, as shown in FIG. 17.

Referring to FIGS. 2 to 6, an assembly machine for implanting pins 9 has a protective casing 98 covering a retarder 27, a charging hopper 1 connecting a connecting seat 2 and a guide pipe 3 under the connecting seat 2, a guide recess 31 under the guide pipe 3, a pin-separating seat 4 under the guide recess 31, a chuck device 5 which is controlled by the oil cylinder 62 connecting the pin-separating seat 4, a link 61 connecting the chuck device 5 and the oil cylinder 62. The hollow charging hopper 1 has a plurality of spaced driving bolts 11 on the inner rim of the charging hopper 1, a plurality of spaced chutes 13 on the inner surface of a cone-shaped portion 12 below the rim of the charging hopper 1 to receive the pin 10, a connecting seat 2 connects the cone-shaped portion 12, a driving belt recess 14 surrounding the outer periphery of the connecting seat 2, a bearing 2 which is fastened by a retaining ring 16 disposed in the connecting seat 2, a retaining ring 17 restraining the connecting seat 2, a curved block surface 18 beneath the chutes 13 to block the pins 10, a positioning block 251 on the connecting seat 2, a movable shaft 252 adjacent to the positioning block 251, a driving rod 253 connecting the movable shaft 252. The driving rod 253 passes through the first hole 135 on the movable shaft 252. A stretch spring 255 connects a positioning cylinder 256 which is adjacent to the positioning block 251 and a positioning bolt 254 which is disposed on the driving rod 253. The connecting seat 2 and the cone-shaped portion 12 are communicated via an enlarged notch 19. Surface A and surface B are inclined surfaces. A pin-setting rod 258 passes through the second hole 136 on the movable shaft 252. The bolt 20 fastens the driving rod 253 on the movable shaft 252. The bolt 201 fastens the pin-setting rod 258 on the movable shaft 252. The pin-setting rod 258 which connects the movable shaft 252 adjacent to a guide notch 22 of a guide plate 21 is disposed in the connecting seat 2. The distal end of the pin-setting rod 258 has a side notched surface 259 and an upper inclined surface 26. A guide passage 23 which communicates with the guide notch 22 passes through the guide pipe 3.

Referring to FIGS. 7, 8, 9, 9A, 9B and 9C, a pin-separating seat 4 has a slot 41 communicating with the guide recess 31, a plurality of ball recess holes 42 at two walls adjacent to the slot 41 to receive each ball 43. A gap 48 is formed at the bottom of the slot 41, a movable plate 49 is disposed at the bottom of the pin-separating seat 4, and a tension spring 495 is positioned at the bottom of the movable plate 49. Each ball 43 is entrapped by a coiled spring 44. A padding plate 45 and the pin-separating seat 4 are fastened by bolts 46 and 47. A movable door 32 which covers the guide recess 31 is connected to the machine 9 via two L-shaped plates 33 and 34. The upper plate 491 and the lower plate 492 are fastened by a bolt 494. The bolt 496 which is under the movable plate 49 and the bolt 494 are connected by the spring 495. A slide way 493 is formed in the movable plate 49.

Figure 10:
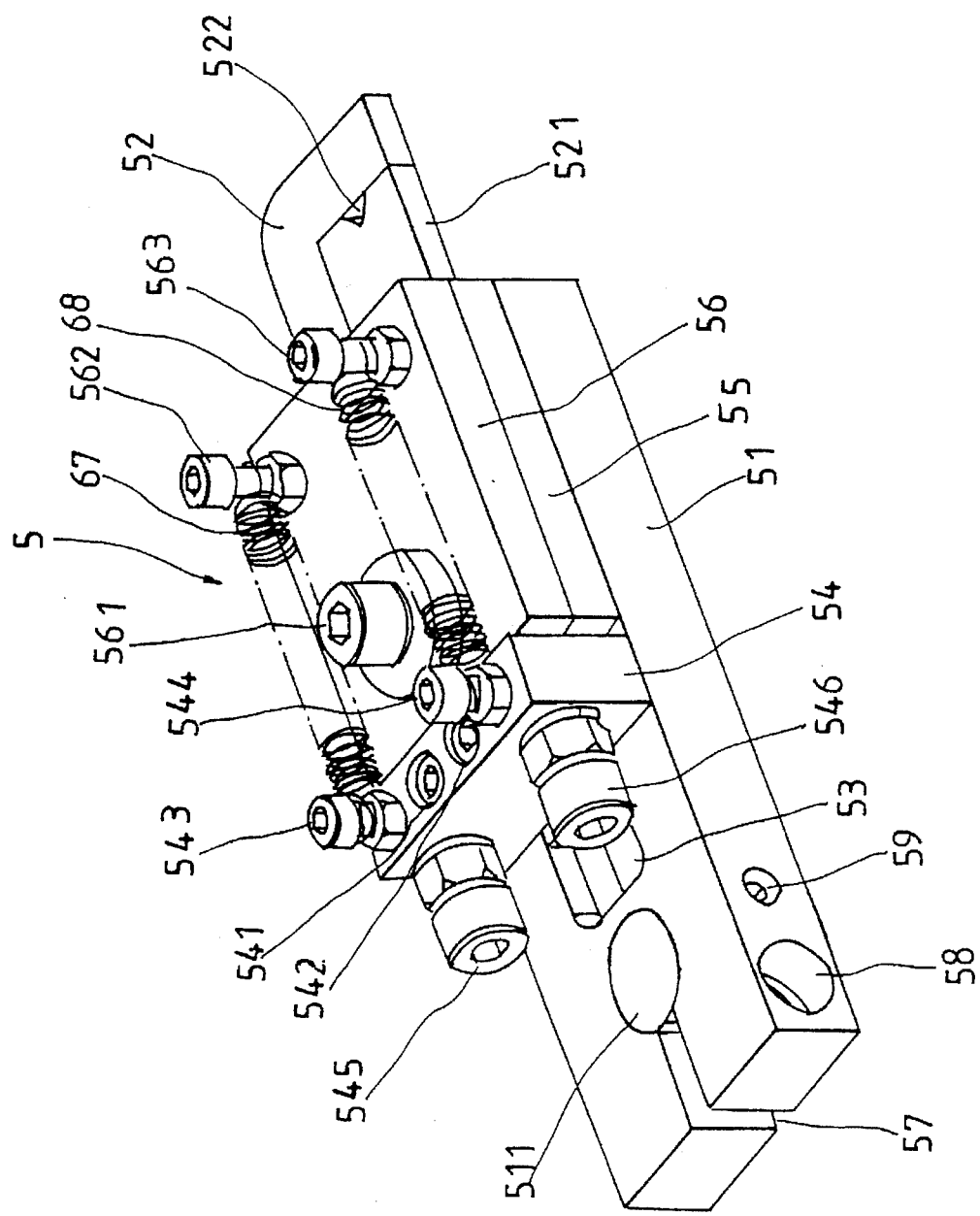
FIG. 10 is a perspective view of a chuck device.
Figure 11:
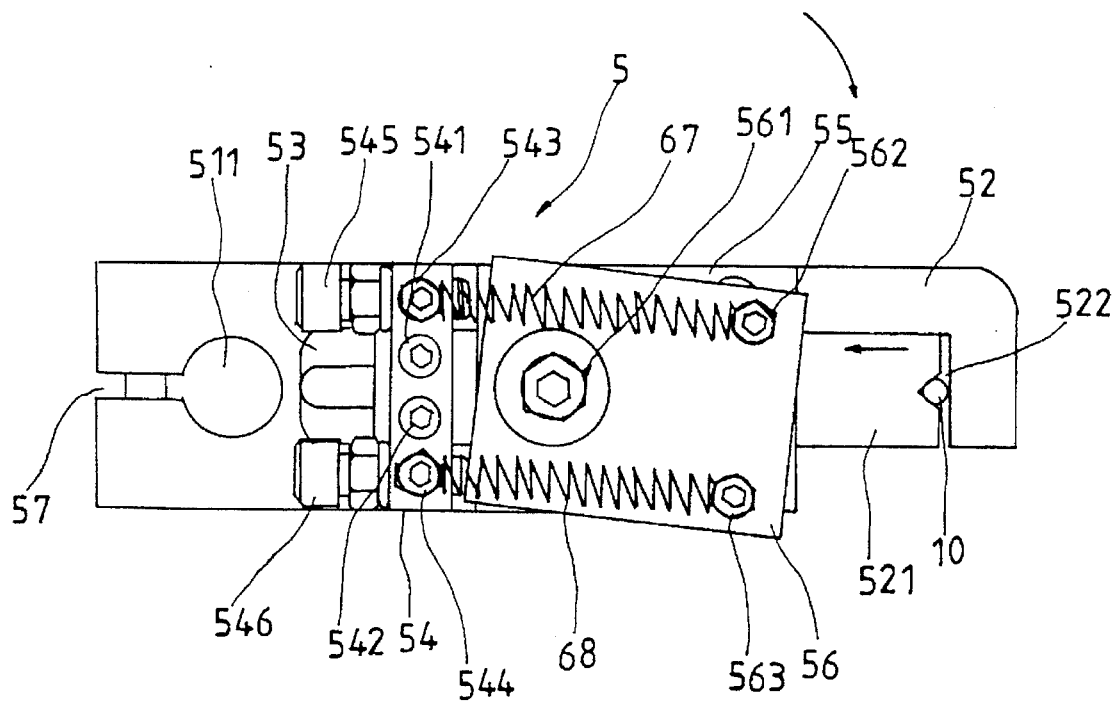
FIGS. 11 and 11A are schematic views illustrating the operation of the chuck device.
Figure 11A:
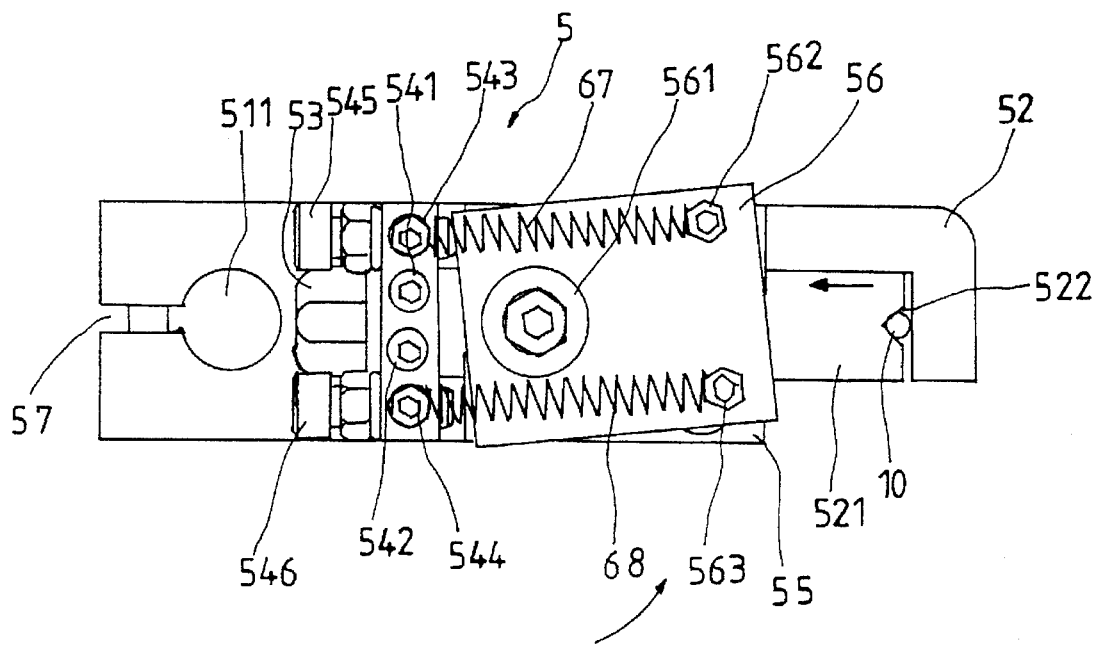
Figure 12:
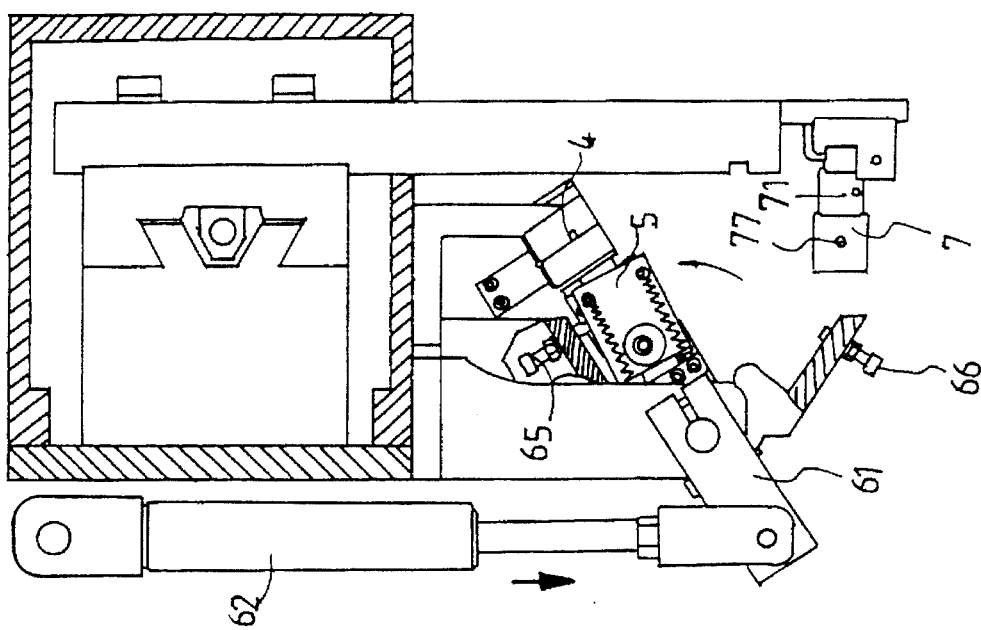
FIGS. 12 and 12A are schematic views illustrating the operation of the oil cylinder, the chuck device, the pin-clamping funnel and the pin-separating seat.
Figure 12A:
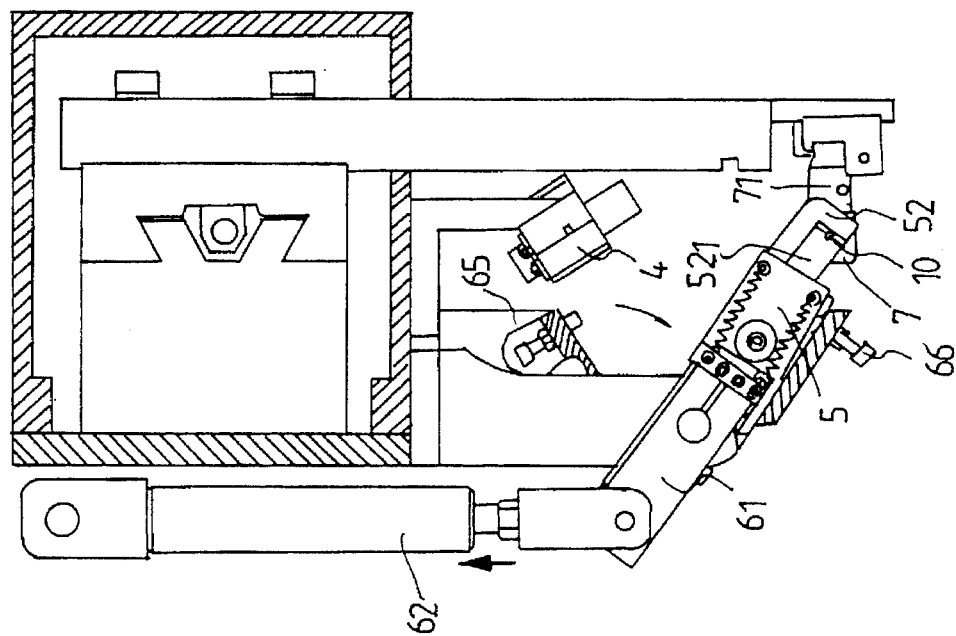

Referring to FIGS. 10, 11 and 11A, the chuck device 5 has a bottom plate 51, an L-shaped chuck 52 extending from the front of the bottom plate 51, an extensible plate 521 between the L-shaped chuck 52 and the bottom plate 51, a chuck notch 522 formed at the front end of the extensible plate 521, a rear board 54 connecting the rear end of the extensible plate 521, an upper board 56 and a lower board 55 which are disposed in front of the rear board 54 overlapped on the bottom plate 51. The bottom plate 51 has two threaded holes 58 and 59. The rear board 54 has two bolt holes 541 and 542 and two bolts 543 and 544 on the top and two bolts 545 and 546 at one side. Two bolts 562 and 563 and a central bolt 561 are disposed on top of the upper board 56. Two bolts 543 and 562 are connected by a tension spring 67. Two bolts 544 and 563 are connected by a tension spring 68. A slide groove 53 which is formed on the bottom plate 51 restrains the movement of the L-shaped chuck 52. A circular hole 511 which is formed at the rear portion of the bottom plate 51 receives a link 61 (as shown in FIGS. 12 and 12A). The end slot 57 is formed at the rear end of the bottom plate 51.

Referring to FIGS. 12 and 12A, an oil cylinder 62 connects the link 61 which connects the chuck device 5. When the L-shaped chuck 52 moves toward the pin-separating seat 4, the adjusting bolt 66 departs from the L-shaped chuck 52 and the adjusting bolt 65 abuts the L-shaped chuck 52. When the L-shaped chuck 52 moves toward the pin-clamping funnel 7, the adjusting bolt 65 departs from the L-shaped chuck 52 and the adjusting bolt 66 abuts the L-shaped chuck 52.

Figure 13A:
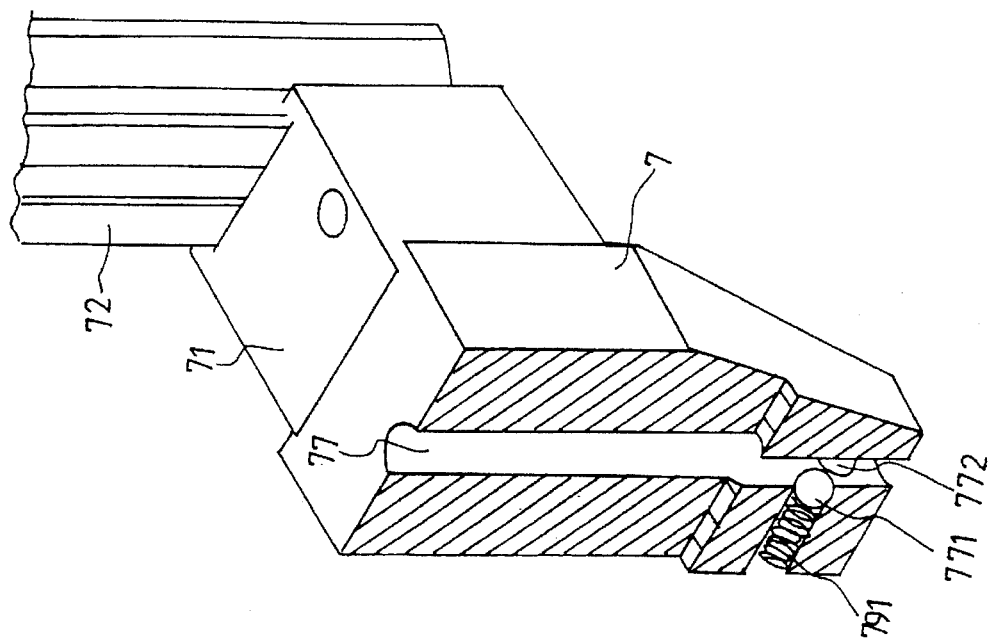
FIG. 13A is a partially cross-sectional view of FIG. 13.
Figure 13:
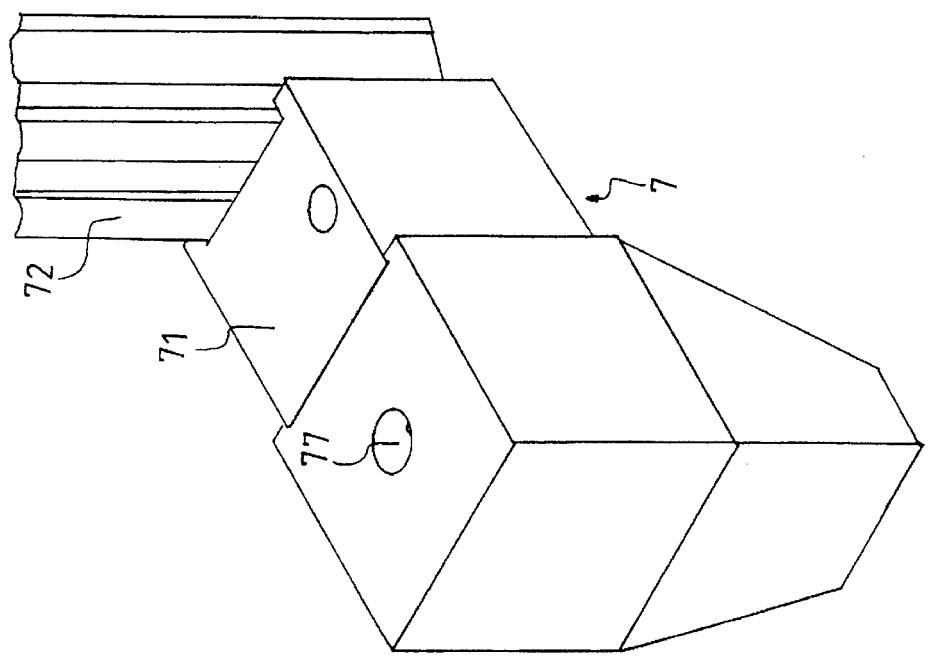
FIG. 13 is a perspective view of a pin-clamping funnel.

Referring to FIGS. 13 and 13A, the pin-clamping funnel 7 which has a guide hole 77 includes a small block 71 connecting a ball slide rail 72. Two ball hloes 771 and 772 are formed on the two walls adjacent to the guide hole 77 to receive each ball 781. Each ball 781 is entrapped by a coiled spring 791.

Figure 14:
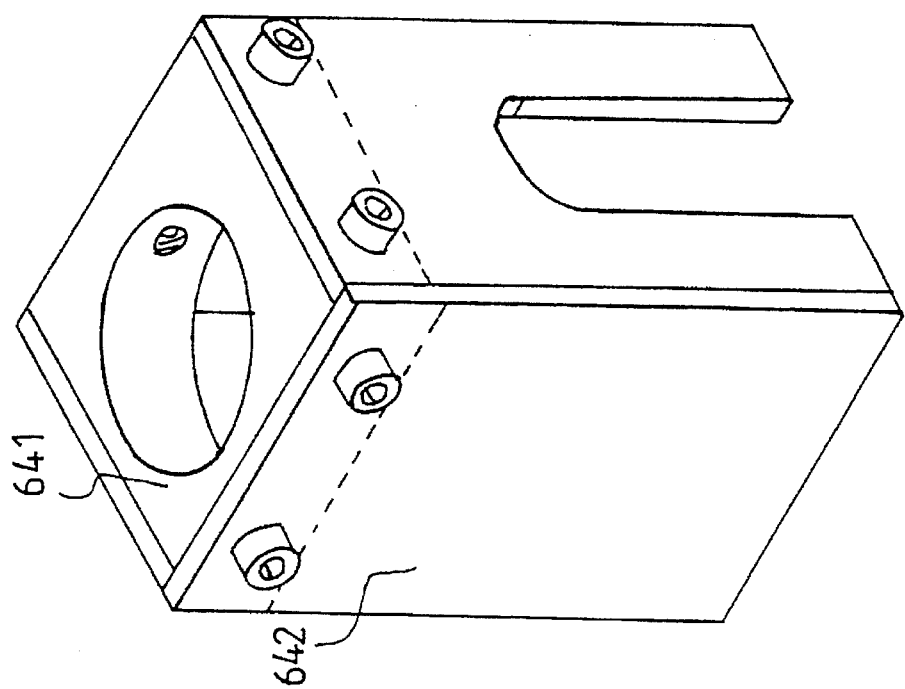
FIG. 14 is a perspective view of a rectangular block enclosed by an outer casing.

FIG. 14 illustrates a rectangular block 641 enclosed by an outer casing 642.

Figure 15:
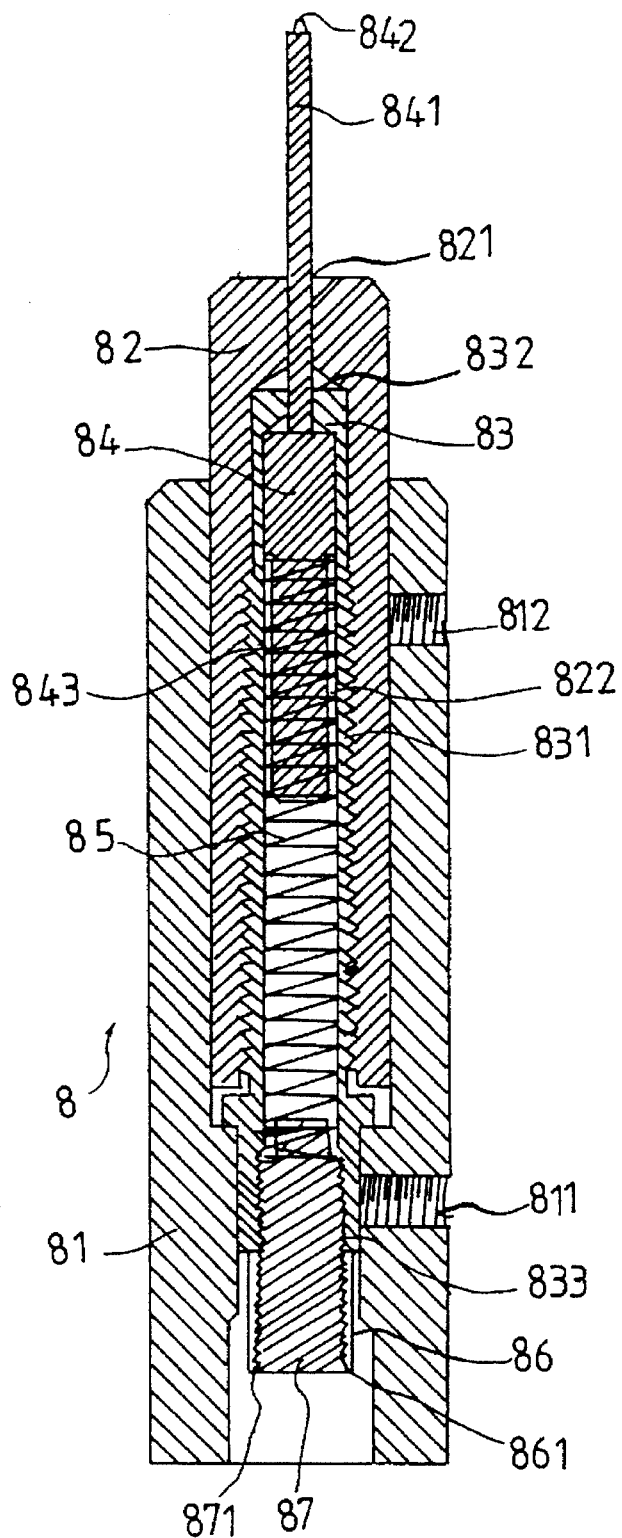
FIG. 15 is a cross-sectional view of a pin-guiding device.
Figure 15A:
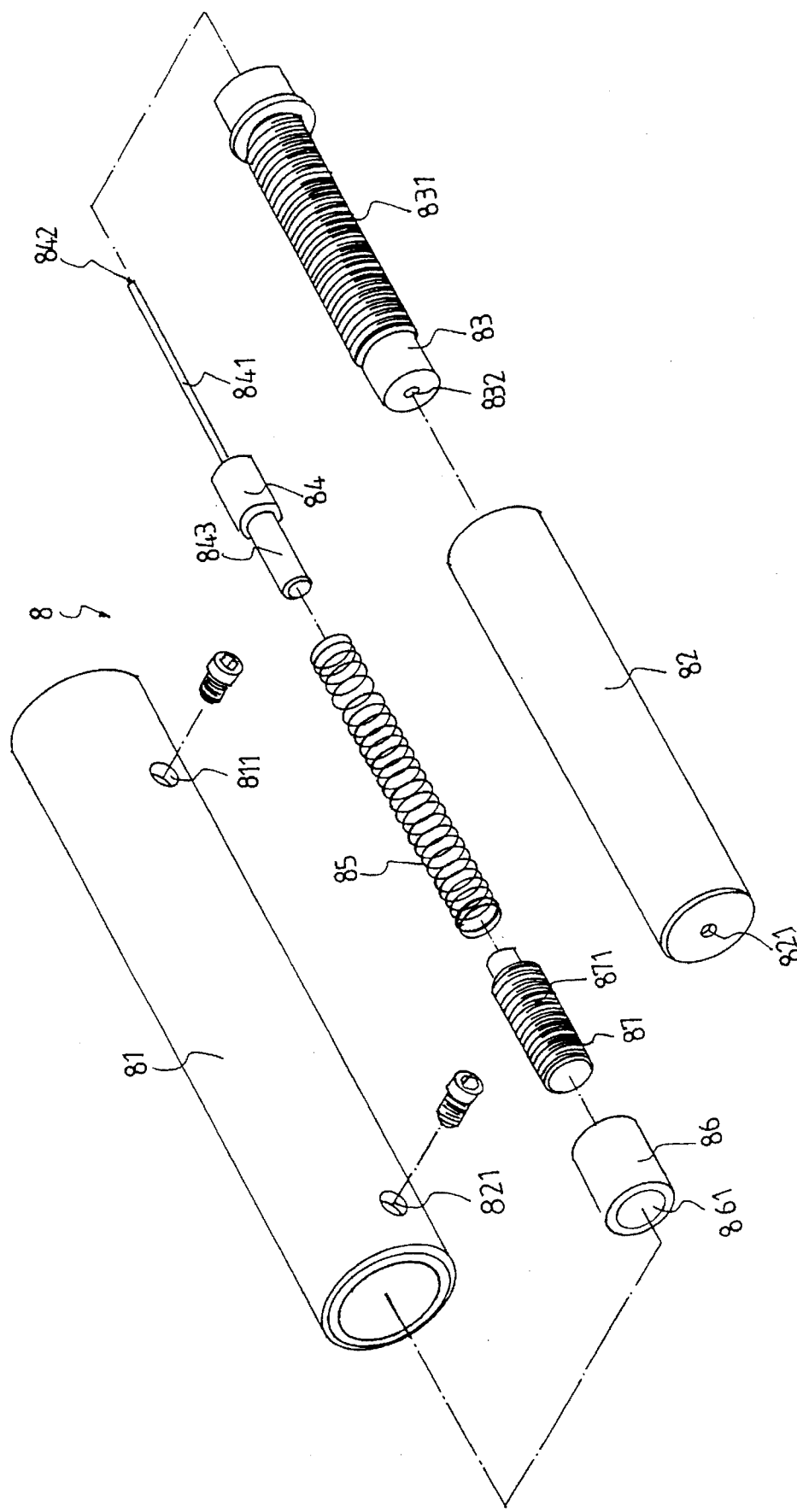
FIG. 15A is a perspective exploded view of FIG. 15.
Figure 16:
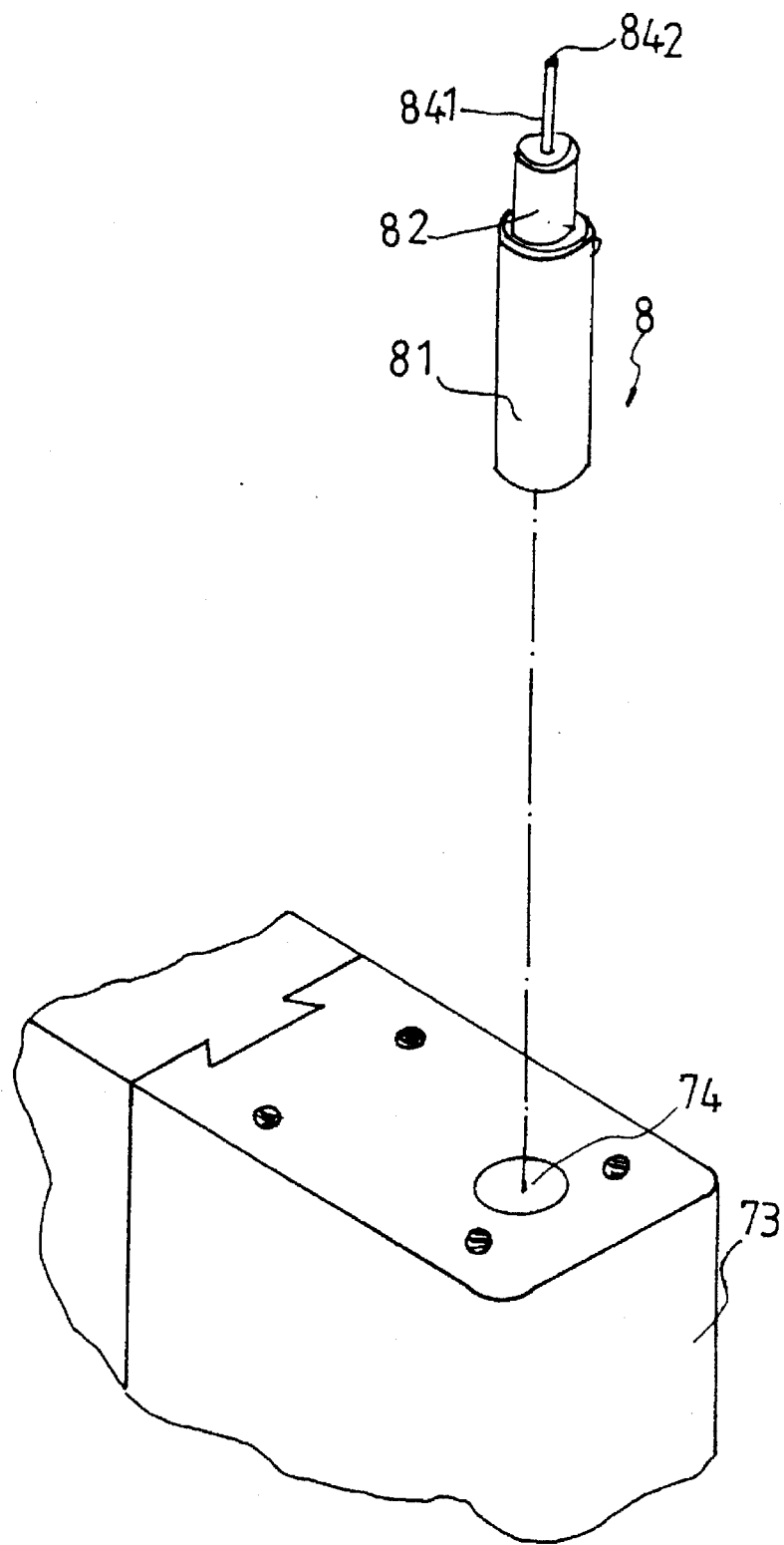
FIG. 16 is a perspective exploded view of a pin-guiding device and a pin-guiding seat.

Referring to FIGS. 15, 15A and 16, a pin-guide device 8 has an outer pipe 81, a middle pipe 82 enclosed by the outer pipe 81, an inner pipe 83 enclosed by the middle pipe 82, and a guide rod 841 which has a guide needle 842 at the distal end. The inner pipe 83 has an outer thread 831 and a round aperture 832 which is inserted by a guide rod 841. The guide rod 841 is extended from the front of a pin rod 84. A cylinder rod 843 is disposed at the back of the pin rod 84. A spring 85 which receives the cylinder rod 843 is inserted in the middle pipe 82. A terminal pipe 86 which has an inner thread 861 to match the outer thread 871 of a terminal block 87 is disposed between the middle pipe 82 and the outer pipe 81. The front end of the terminal block 87 is inserted in the circular aperture 821 of the middle pipe 82. The outer pipe 81 has threaded holes 811 and 812 to receive bolts. The pin-guiding seat 73 has a seat hole 74 to receive the pin-guide device 8.

Referring to FIGS. 17, 17A, 17B, 17C and 17D, a pin-clamping funnel 7 which is supported by a small block 71 connecting a ball slide rail 72 receives a plunger 64 which connects an oil cylinder 63. The oil cylinder 63 connects a rectangular block 641 which is enclosed by an outer casing 642. The pin-guiding device 8 which has an outer pipe 81 enclosing a middle pipe 82 is supported by a pin-guiding seat 73. The middle pipe 82 supports a guide rod 841 which has a guide needle 842 at the distal end.

Figure 18:
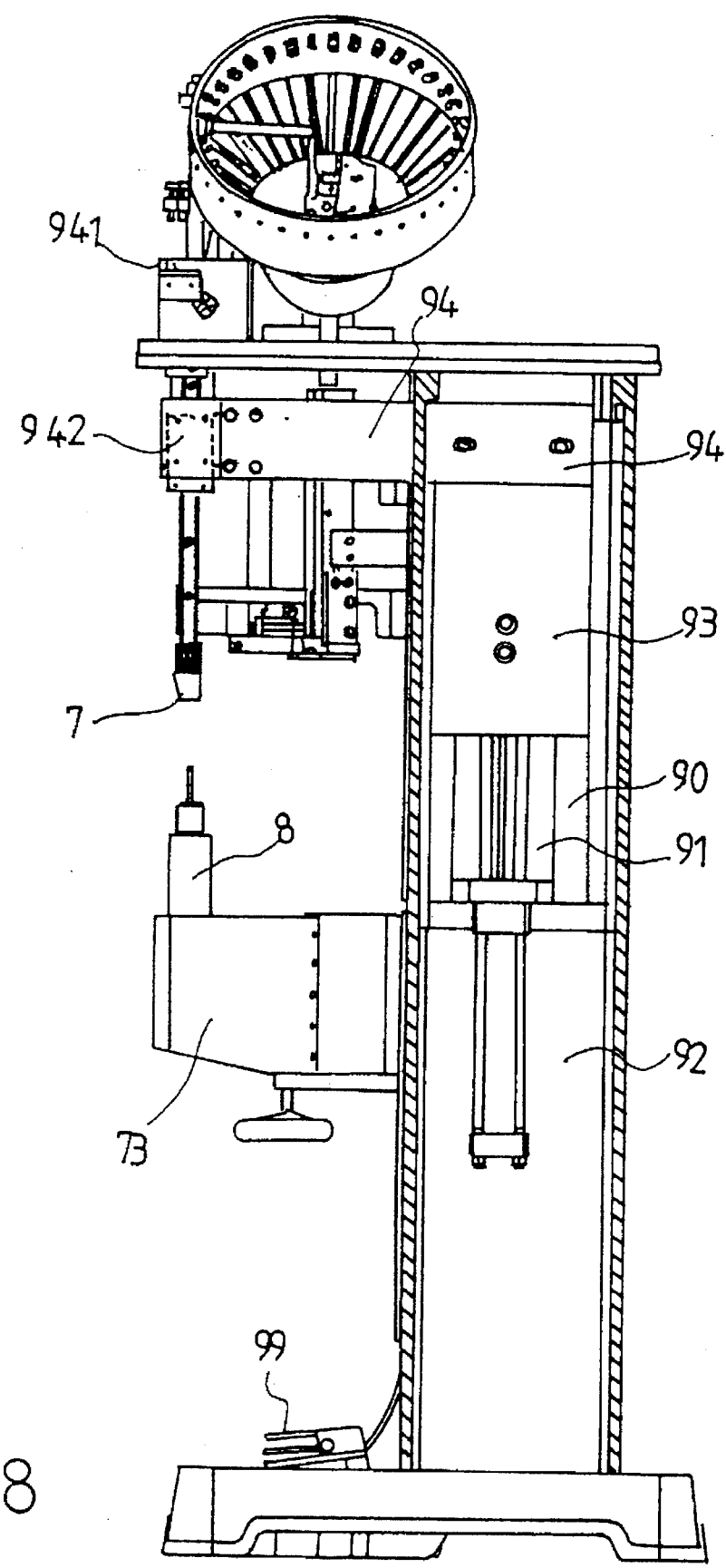
FIG. 18 is a partially cross-sectional view of an assembly machine.
Figure 19:
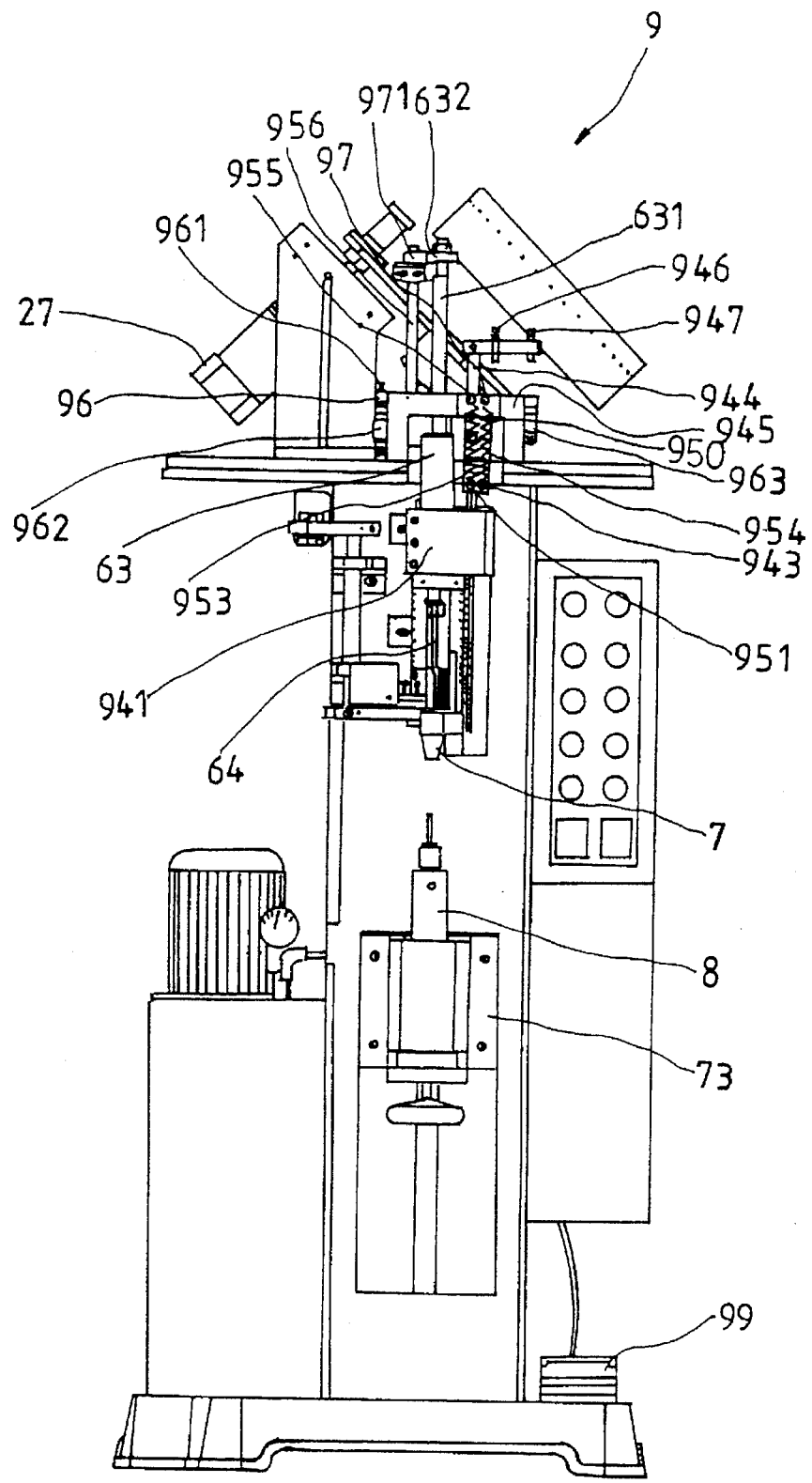
FIG. 19 is a front elevational view of an assembly machine.

Referring to FIGS. 18 and 19, a slide seat 90 which encloses a slide mount 91 is disposed between an oil cylinder 92 and a movable seat 93. A support plate 94 which is disposed on the movable seat 93 is under the charging hopper 1. A seat block 941 which abuts the support plate 94 encloses a movable block 942. The movable block 942 connects the outer casing 642. The L-shaped support 944 is mounted on the U-shaped mount 945, and the U-shaped mount 945 is positioned by bolts 946 and 947. A bolt 950 is disposed under the mount 945. A small block 943 has two bolts 951 and 952. A spring 953 connects the bolt 951 and the bolt 955 on the mount 945. A spring 954 connects the bolt 952 and the bolt 956 on the mount 945. Two proximity switches 962 and 963 are disposed on the mount 945. The switch 96 is disposed on the proximity switche 962 and fastened by a bolt 961. A round bar 97 which is disposed on the mount 945 is connected to a switch 971. An upper arbor 631 which is disposed on the mount 945 is connected to a pressing plate 632. The oil cylinder 63 is disposed below the mount 945. A pedal switch 99 is disposed on the bottom of the machine 9.

I claim:

1. An assembly machine for implanting pins comprising:
    a protective casing 98 which covers a retarder 27, a charging hopper 1 connecting a connecting seat 2 and a guide pipe 3 under the connecting seat 2, a guide recess 31 under the guide pipe 3, a pin-separating seat 4 under the guide recess 31, a chuck device 5 which is controlled by the oil cylinder 62 connecting the pin-separating seat 4, a link 61 connecting the chuck device 5 and the oil cylinder 62, and wherein the improvement comprises:
    the hollow charging hopper 1 having a plurality of spaced driving bolts 11 on the inner rim of the charging hopper 1, a plurality of spaced chutes 13 on the inner surface of a cone-shaped portion 12 below the rim, a connecting seat 2 connecting the cone-shaped portion 12, a positioning block 251 disposed on the connecting seat 2, a movable shaft 252 adjacent to the positioning block 251, a driving rod 253 connecting the movable shaft 252, the distal end of the driving rod 253 connecting a bearing 257, a stretch spring 255 connecting a positioning cylinder 256 which is adjacent to the positioning block 251 and a positioning bolt 254 which is disposed on the driving rod 253, a pin-setting rod 258 which connects the movable shaft 252 adjacent to a guide notch 22 of a guide plate 21 disposed on the connecting seat 2;
    the pin-separating seat 4 having a slot 41 communicating with the guide recess 31, a plurality of ball recess holes 42 at two walls adjacent to the slot 41 in order to receive each ball 43, each ball 43 , entrapped by a coiled spring 44, a gap 48 formed at the bottom of the slot 41, a movable plate 49 disposed at the bottom of the pin-separating seat 4, a tension spring 495 positioned at the bottom of the movable plate 49;
    the chuck device 5 having a bottom plate 51, an L-shaped chuck 52 extending from the front of the bottom plate 51, an extensible plate 521 disposed between the L-shaped chuck 52 and the bottom plate 51, a chuck notch 522 formed at the front end of the extensible plate 521, a rear board 54 connecting the rear end of the extensible plate 521, an upper board 56 and a lower board 55 which are disposed in front of the rear board 54 overlapped on the bottom plate 51;

a pin-clamping funnel 7 which clamps a pin 10 matching a pin-guiding device 8;

the pin-clamping funnel 7 receiving a plunger 64 which connects an oil cylinder 63, the oil cylinder 63 connecting a rectangular block 641 which is enclosed by an outer casing 642; and the pin-guiding device 8 supported by a pin-guiding seat 73.

2. An assembly machine for implanting pins as claimed in claim 1, wherein the chuck device 5 has a bottom plate 51, an L-shaped chuck 52 extending from the front of the bottom plate 51, an extensible plate 521 between the L-shaped chuck 52 and the bottom plate 51, a chuck notch 522 formed at the front end of the extensible plate 521, a rear board 54 connecting the rear end of the extensible plate 521, an upper board 56 and a lower board 55 which are disposed in front of the rear board 54 overlapped on the bottom plate 51.

3. An assembly machine for implanting pins as claimed in claim 1, wherein the pin-guide device 8 has an outer pipe 81, a middle pipe 82 enclosed by the outer pipe 81, an inner pipe 83 enclosed by the middle pipe 82, and a guide rod 841 which has a guide needle 842 at the distal end.

* * * * *